United States Patent
Mattos et al.

(10) Patent No.: US 7,406,113 B2
(45) Date of Patent: Jul. 29, 2008

(54) INTEGRATED CIRCUIT FOR CODE ACQUISITION

(75) Inventors: Philip Mattos, Ruardean Woodside (GB); Marco Losi, Bollate (IT)

(73) Assignees: STMicroelectronics Limited, Bristol (GB); STMicroelectronics S.r.l., Agrate Brianza (IT)

( * ) Notice: Subject to any disclaimer, the term of this patent is extended or adjusted under 35 U.S.C. 154(b) by 615 days.

(21) Appl. No.: 10/632,566

(22) Filed: Aug. 1, 2003

(65) Prior Publication Data
US 2004/0120385 A1    Jun. 24, 2004

(30) Foreign Application Priority Data
Aug. 2, 2002    (EP)    ............................. 02255422

(51) Int. Cl.
*H04B 1/00*    (2006.01)
(52) U.S. Cl. ............... 375/150; 375/142; 375/143; 375/149; 375/326
(58) Field of Classification Search ............. 375/150, 375/142, 326, 143, 149
See application file for complete search history.

(56) References Cited

U.S. PATENT DOCUMENTS

| | | | | |
|---|---|---|---|---|
| 5,144,641 A | 9/1992 | Akazawa et al. | ............... | 375/1 |
| 5,420,593 A | 5/1995 | Niles | ............... | 342/357 |
| 5,467,367 A | 11/1995 | Izumi et al. | ............... | 375/206 |
| 5,856,997 A | 1/1999 | Mochizuki | ............... | 345/200 |
| 5,914,933 A | 6/1999 | Cimini et al. | ............... | 370/208 |
| 5,966,411 A | 10/1999 | Struhsaker | ............... | 375/332 |
| 5,999,561 A | 12/1999 | Naden et al. | ............... | 375/206 |
| 6,041,074 A | 3/2000 | Nakamura | ............... | 375/200 |
| 6,201,843 B1 | 3/2001 | Kingston et al. | ............... | 375/350 |
| 6,289,041 B1 | 9/2001 | Krasner | ............... | 375/152 |
| 6,574,558 B2 * | 6/2003 | Kohli | ............... | 701/213 |
| 6,775,319 B2 | 8/2004 | King et al. | ............... | 375/150 |
| 6,845,124 B2 * | 1/2005 | Mattos et al. | ............... | 375/150 |
| 6,888,879 B1 * | 5/2005 | Lennen | ............... | 375/149 |
| 7,061,972 B1 * | 6/2006 | Best | ............... | 375/150 |
| 2002/0012387 A1 | 1/2002 | Shakeri et al. | ............... | 375/150 |
| 2004/0122881 A1 * | 6/2004 | Mattos et al. | ............... | 708/422 |

FOREIGN PATENT DOCUMENTS

| | | |
|---|---|---|
| EP | 0 563 020 A2 | 9/1993 |
| EP | 0 880 238 A2 | 11/1998 |
| GB | 2 364 487 A | 1/2002 |
| WO | WO 01/35525 A1 | 5/2001 |

OTHER PUBLICATIONS

Wendt, P., "Nonrecursive and Recursive Stack Filters and their Filtering Behavior," *IEEE Transactions on Acoustics, Speech and Signal Processing* 38(12):2099-2107, Dec. 1990.

* cited by examiner

*Primary Examiner*—Ted Wang
(74) *Attorney, Agent, or Firm*—Lisa K. Jorgenson; Dennis M. de Guzman; Seed IP Law Group PLLC

(57) ABSTRACT

A semiconductor integrated circuit for processing a plurality of received broadcast signals, such as GPS signals, is operable in two modes: acquisition and tracking. In an acquisition mode, sample reducer combines samples of a received signal for correlation with a locally generated version of a GPS code. In a tracking mode, the sampled signal is provided direct to the correlators without sample reduction. The same correlators are thereby used to increase acquisition speed.

27 Claims, 8 Drawing Sheets

INTEGRATED CIRCUIT FOR CODE ACQUISITION

BACKGROUND OF THE INVENTION

1. Field of the Invention

The present disclosure relates generally to the acquisition and tracking of broadcast pseudo random codes, in particular but not exclusively to codes transmitted as part of a GPS signal.

2. Description of the Related Art

The Global Position System (GPS) is a well-known system which uses broadcast pseudo random codes to allow receivers to determine time differences, and hence relative positions, between a transmitter and receiver. The transmitters are satellites orbiting the earth in known orbit paths whose position at any given time is accurately known. Using received signals from four such satellites, a receiver can unambiguously determine its position using trigonometry to an accuracy dependent upon the repetition rate of the code, accuracy of components and other factors, such as the atmosphere and multipath reflections.

To increase accuracy, more than the minimum of four reference transmitters are usually tracked. There are around 24 satellites available for tracking in the GPS system, of which 8 are specified to be Avisible@ by a receiver at any given time. In fact, GPS receivers typically include 12 channels to allow up to 12 satellites to be tracked at once.

GPS satellites transmit two L-Band signals which can be used for positioning purposes. The reasoning behind transmitting using two different frequencies is so that errors introduced by ionospheric refraction can be eliminated.

The signals, which are generated from a standard frequency of 10.23 MHz, are L1 at 1575.42 MHz and L2 at 1227.60 MHz and are often called the carriers.

The frequencies are generated from the fundamental satellite clock frequency of $f_0$=10.23 MHz.

| Signal | Frequency (MHz) | Wavelength (cm) |
|--------|-----------------|-----------------|
| L1 | $154f_o$ = 1575.42 | ~19 |
| L2 | $120f_o$ = 1227.60 | ~24 |

Since the carriers are pure sinusoids, they cannot be used easily for instantaneous positioning purposes and therefore two binary codes are modulated onto them: the C/A (coarse/acquisition) code and P (precise) code.

Also it is necessary to know the coordinates of the satellites and this information is sent within the broadcast data message which is also modulated onto the carriers.

The coarse/acquisition (CA) code was so named as it was originally designed as a coarse position measurement signal on its own, or as an acquisition code to assist in looking onto the phase of the precise code. However, the CA code is now used generally both for acquisition and for position tracking, and so will be referred to simply as the CA code herein.

The C/A code is a pseudo random (PN) binary code (states of 0 and 1) having 1,023 elements, or chips, that repeats itself every millisecond. The term pseudo random is used since the code is apparently random although it has been generated by means of a known process, hence the repeatability.

Due to the chipping rate (the rate at which each chip is modulated onto the carrier) of 1.023 Mbps, the chip length corresponds to approximately 300 m in length and due to the code length, the ambiguity is approximately 300 km—i.e., the complete C/A code pattern repeats itself every 300 km between the receiver and the satellite.

The code is generated by means of a linear feedback register which is a hardware device representing a mathematical PRN algorithm.

The sequences that are used are known as Gold codes which have particularly good autocorrelation and cross correlation properties. The cross correlation properties of the gold codes are such that the correlation function between two different sequences is low—this is how GPS receivers distinguish between signals transmitted from different satellites.

The receiver needs to know the actual position of satellites in addition to knowing its relative position to them, and for that reason a data message is broadcast. The data message includes information describing the positions of the satellites and their health status.

Each satellite sends a full description of its own orbit and clock data (within the ephemeris information) and an approximate guide to the orbits of the other satellites (contained within the almanac information).

The data is modulated at a much slower rate of 50 bps and thus it takes 12.5 minutes to transmit all of the information. To reduce the time it takes to obtain an initial position, the ephemeris and clock data is repeated every 30 seconds. Parameters representing the delay caused by signal propagation through the ionosphere are also included within the data message.

The broadcast data message is modulo-2 added to the C/A code. This inverts the code and has the effect of also inverting the signal after correlation allowing the data to be recovered.

Binary biphase modulation (also known as binary phase shift keying [BPSK]) is the technique that is used to modulate the codes onto the initial carrier waves.

The codes are now directly multiplied with the carrier, which results in a 180 degree phase shift of the carrier every time the state of the code changes.

The modulation techniques also have the properties of widening the transmitted signal over a much wider frequency band than the minimum bandwidth required to transmit the information which is being sent. This is known as spread spectrum modulation and has the benefits of developing processing gain in the despreading operation within the receiver, and it helps prevent possible signal jamming.

The L1 signal is modulated by both the C/A code and the P code, though only the CA code is relevant to the present description. This is done by modulating one code in phase and the other in quadrature (i.e., they are at 90 degrees to each other).

A representation of the CA code, data message bits and the resultant signal spectrum is shown in FIG. 1. As can be seen, the thermal noise level is higher than the actual signal level. In fact, the thermal noise is around −110 dB per MHz whereas the signal itself is around −130 dB. To extract the CA code from the noise, use is made of the fact that the CA code is a known sequence and correlation is performed. The function performed is to integrate the received signal with a locally generated version of the CA code, as follow:

$$\int_0^{20\,ms} (\text{signal} + \text{noise}) \times CA \text{ code} = \int_0^{20\,ms} (\text{carrier} \times \text{data} \times CA \text{ code}) \times$$

$$CA \text{ code} + \int_0^{20\,ms} (\text{noise}) \times CA \text{ code}$$

$$= \int_0^{20\,ms} (\text{carrier} \times \text{data} \times 1) + (0)$$

As can be seen, the integration of white noise over the integration period is substantially zero, whereas the integration of the CA code×CA code is 1.

The result of the integration is that the noise component does not increase in signal level, but that (carrier×data component CA code is increased by 20,000=+43 dB. The signal to noise ratio is now:

−130 dB (signal) +110 dB (noise)+43 dB (integration gain)=+23 dB

The signal energy thereby becomes distinguishable from the noise. A digital signal processor 10 for performing the above function is shown in FIG. 2. Prior to digital processing, the received radio frequency (RF) signal is filtered within a radio chip (FIG. 2*a*) to reject parts of the signal not in the L1 bandwidth (a filter with central frequency 1575 MHz and bandwidth 20 MHz or narrower). The signal is then mixed with a sinusoid generated by a local oscillator, resulting in the generation of a signal with sum and difference frequency components. A further filter of around 2 MHz bandwidth selects the desired signal. The signal produced is an IF signal which is sampled by the downconverter 12 at a rate defined by the clock generator 14 to convert to digital. The rate is typically a multiple of 1.023 MHz which is the CA code chip rate (in this case 4.092 MHz).

The signal is then copied and sent into typically 12 separate channels 16, each channel being arranged to extract the code and carrier information for a particular satellite. A replica of the CA code for the particular satellite is generated by a prn 18 and correlated with the signal in each channel 16. Two replica codes are actually used for the correlations; one delayed (late) and one advanced (early). The early and late codes lie on the slope of the correlation function either side of the peak, and are used in continuous tracking of the code to reduce tracking error. The signal is then processed for the data modulation and carrier phase measurements. A locally generated carrier is generated by a numerically controlled oscillator (NCO) 22 and a second downconverter 20 used to reject images prior to an output block 24.

When correlating to acquire the signal the time and hence code phase of the incoming signal is an unknown. It is necessary, therefore, to compare 2×1,023=2,046 acquisition samples of the CA code signal for every possible relative position of the incoming and locally generated CA codes, with an integration period of typically 1 millisecond. It thus takes around 2 seconds to acquire the first satellite using one channel. Thereafter the position of the sequence is known and tracking requires only two correlations, rather than 2046, to maintain the tracking position within a few nanoseconds window of the early and late measurements.

We have appreciated the need for a large number of correlations for acquisition of signals, but only a few correlations to track the signals after acquisition. We have further appreciated disadvantages of known solutions which use large numbers of correlators.

BRIEF SUMMARY OF THE INVENTION

A circuit of an embodiment of the invention samples a received signal by combining bits in a received digitized signal prior to correlation, thereby speeding the correlation process.

One aspect provides a semiconductor integrated circuit for processing a plurality of received broadcast signals, the broadcast signals being of a type each having a different respective known digital code. The semiconductor integrated circuit includes:

a digital sampler;

a sample reducer; and a plurality of correlators being arranged to be operable in two modes wherein:

in an acquisition mode:

the digital sampler samples the received broadcast signals to produce a digital bit stream at a first bit rate;

the sample reducer reduces bits of the digital bit stream by combining groups of N bits together to produce a reduced digital bit stream;

the plurality of correlators receive the reduced digital bit stream at a second bit rate, being higher than the first bit rate, and each of the plurality of correlators correlates the reduced digital bit stream with a same locally generated version of one of the different known digital codes; and in a tracking mode:

the digital sampler samples the received broadcast signals to produce a digital bit stream at the first bit rate and provides that digital bit stream direct to each of the plurality of correlators, each correlator correlates that digital bit stream with a different locally generated version of one of the known digital codes.

According to one aspect, in acquisition mode, the second bit rate is a factor M higher than the first bit rate.

According to one aspect, there are Y correlators such that in acquisition mode a correlation rate is a factor X=N (bits)×M (bit rate factor)×Y (correlators) faster than a correlation rate in tracking mode for one of the known digital codes.

According to one aspect, the factor X is chosen to be substantially equal or greater than twice a number of bits in the known code, wherein all possible correlations of the code are performed before the code repeats.

Another aspect provides a method of processing a plurality of received broadcast signals each having a different respective known digital code. The method includes:

sampling the received broadcast signals to produce a digital bit stream at a first bit rate;

reducing bits of the digital bit stream by combining groups of N bits to produce a reduced bit stream;

correlating the reduced digital bit stream at a second bit rate using a plurality of correlators each correlating the reduced digital bit stream with a same one of a locally generated version of the known digital codes to acquire the broadcast signals; and subsequently correlating the digital bit stream at the first bit rate using the plurality of correlators each correlating the reduced digital bit stream with a locally generated version of a different one of the known digital codes to track the previously acquired signals.

According to one aspect, the second bit rate is a factor M higher than the first bit rate.

According to one aspect, there are Y correlators such that when correlating to acquire, a correlation rate is a factor X=N (bits)×M (bit rate factor)×Y (correlators) faster than a correlation rate when tracking the acquired signals.

According to one aspect, the factor X is chosen to be substantially equal or greater than twice a number of bits in the known code, wherein all possible correlations of the code are performed before the code repeats.

BRIEF DESCRIPTION OF THE SEVERAL VIEWS OF THE FIGURES

Embodiments of the invention will now be described by way of example only and with reference to the accompanying figures, in which.

DETAILED DESCRIPTION

Embodiments of an integrated circuit for code acquisition are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
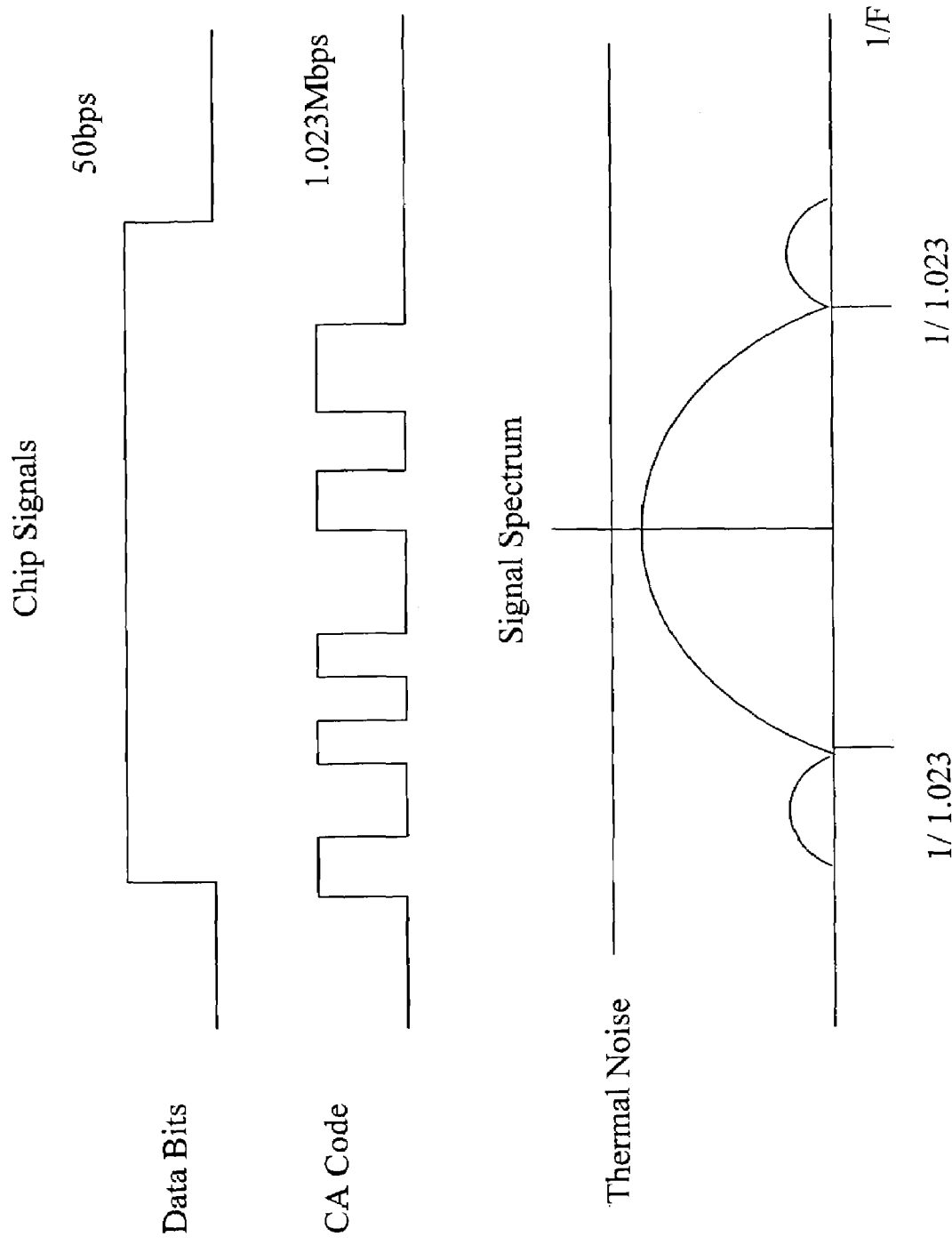
FIG. 1: is a representation of a CA code as used in one embodiment of the present invention and its signal spectrum.
Figure 2:
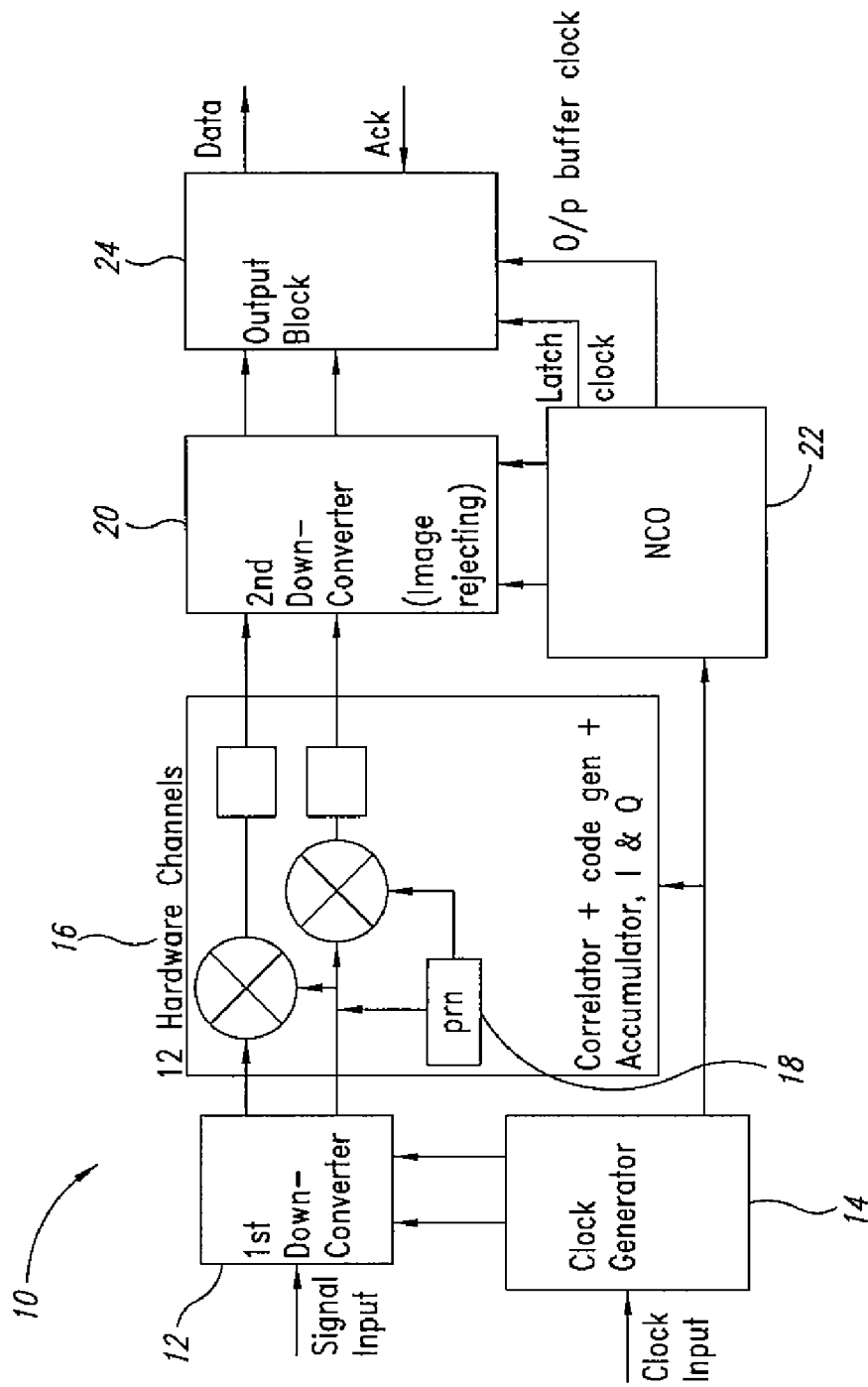
FIG. 2: shows a signal processor.

An embodiment of the invention is a digital signal processor (DSP) 10 for GPS signal acquisition and tracking as previously described in relation to FIG. 2, but modified to include additional functionality, which is operable to increase the speed of signal acquisition. The DSP 10 shown in FIG. 2 comprises a signal input to a first down converter 12, as previously described, which converts a received IF signal containing a repeated code input to digital at the sampled rate defined by clock generator 14, which is a multiple of (1.023 MHz). The digital signal is then provided to a series of 16 channels 16, each used to track one of up to 16 satellites simultaneously in a tracking mode. In tracking mode the respective CA code for a given satellite is fed to the respective channel 16 from a code generator shown as prn 18. When adapted according to an embodiment of the invention, in acquisition mode, all 16 channels may be initially used to acquire the first satellite signal, thereafter each channel tracks the respective satellite.

Figure 2A:
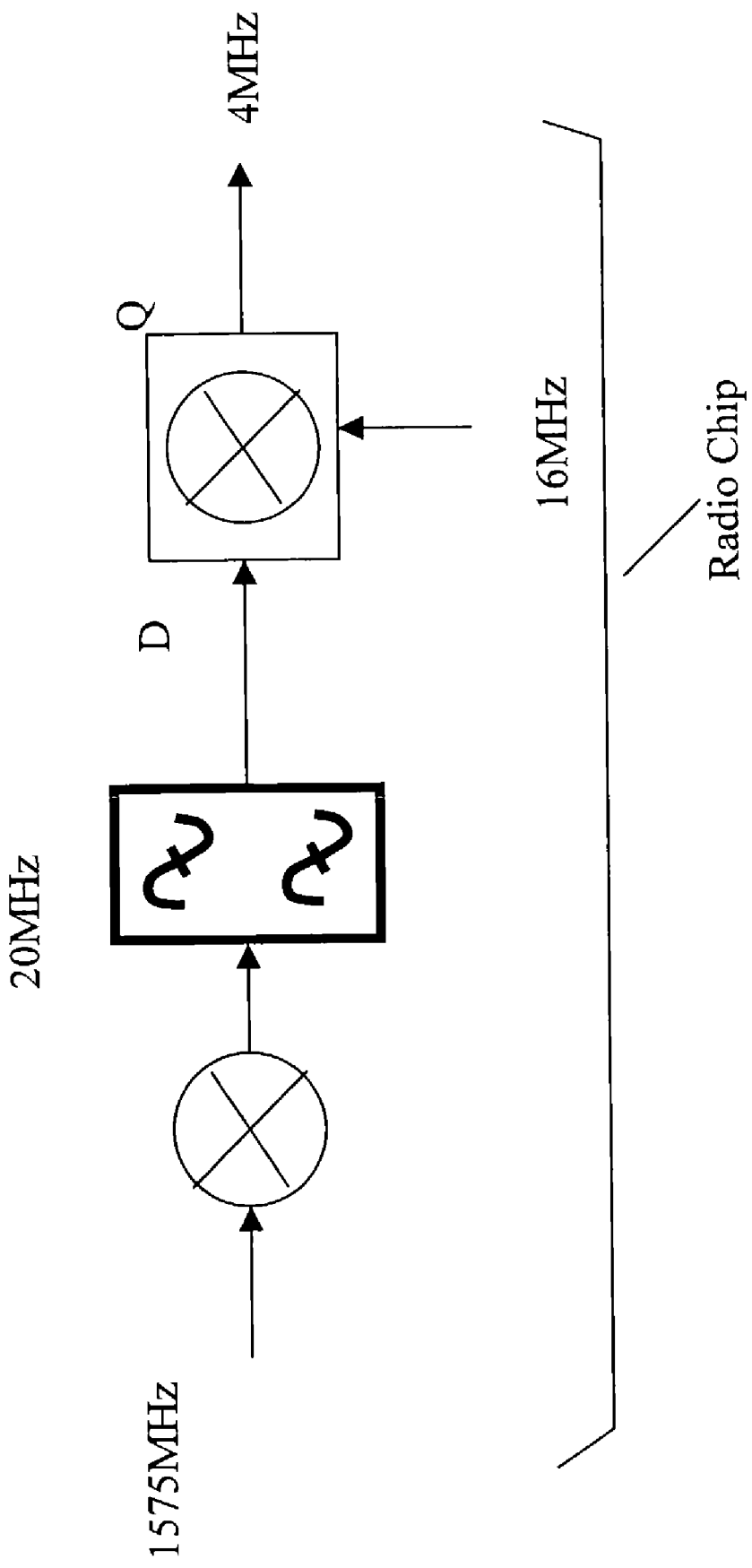
FIG. 2a: shows a radio chip.

The first down converter 10 is shown in expanded view in FIG. 2a. The received signal is filtered and then digitized by sampling at 16 MHz (in fact 16.368 MHz as an example) to produce a digital output.

Figure 3:
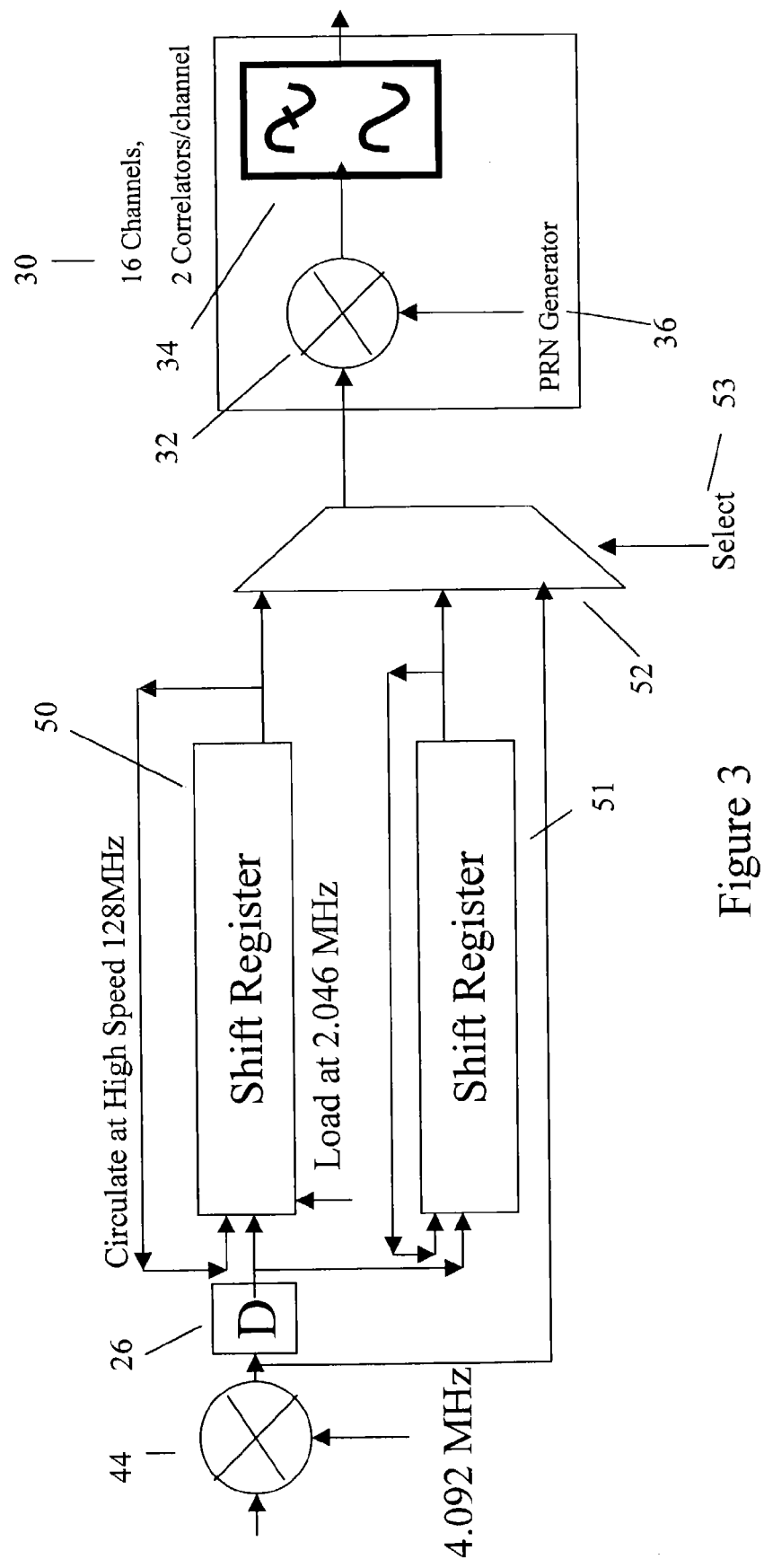
FIG. 3: shows a semiconductor circuit of one embodiment of the invention.

An embodiment of the invention is shown in FIG. 3 and comprises a mixer 44 fed with locally generated 4.092 MHz which connects to a decimator 26. A pair of shift registers 50, 51 receive the output from the decimator and connect to a multiplexer 52 which feeds to 16 channels 30 each comprising a local code generator, shown as PRN generator 36, multiplexer 32, and a low pass filter, 34.

The operation of the embodiment is as follows. The received, down converted, digitized GPS signal is decimated by the decimator 26. This is done by producing a combinatorial output from groups of N samples, thereby reducing the sample rate by a factor of M. The factor M is the number of samples shifted into the decimator 26. Then the decimated samples are loaded into a first shift register 50 at a rate of 2.046 MHz. When the first shift register 50 is full, the input is switched to the second shift register 51 and the output of the first shift register 50 is directed by multiplexer 52 to the channels 30. The output of the first shift register 50 is also looped back to its input. The first shift register 50 is then circulated at a higher than normal frequency, such as 128 MHz. In each channel 30, a PRN generator 36 generates a local version of the CA code and a multiplexer 32 combines the decimated received code with the local version of the CA code. The clock of the correlators and first shift register 50 run at the same multiple of the normal rate thereby performing many searches on the data before the second shift register 51 is full. The number of searches is given by the number of correlators×the factor higher than real time rate of the shift register. Each correlator starts its correlation at a different, evenly spaced point in the local CA code, thereby covering all possible combinations of correlation. At which point, the input is switched to the first register 50 and the multiplexer 52 switches the output of the second register 51 to the correlators.

Note the special case when the sample rate reduction, the overclocking, and the number of correlators combine to allow processing at 2046 or more times real time rate. Then all possible time-domain searches can be performed before switching buffers, so no data is lost and the correlator outputs can be further integrated by hardware or software accumulators, completely separating the integration period (and hence sensitivity) from the size of the input buffers. This greatly enhances sensitivity and reduces silicon area.

Example implementation ×8 decimation, ×8 clock, ×16 channels, ×2 correlators per channel is ×2048 real time.

The hardware can thereby perform all 2046 correlations in 1 ms which is the repeat period of the CA code. This means that every 1 ms when the code repeats it can be correlated for all possible time domains.

The shift registers described could equally be implemented by other. stores such as RAM with counters for addressing. Any buffer store which is capable of reading in at a first rate and reading out a sequence of digital data at a second higher rate will do.

When the signal has been acquired (the relative time difference has been calculated by the correlations), a tracking mode is entered by a select signal 53 switching the input for multiplexer 52 to provide the received, down converted digitized signal direct to the correlators.

Figure 4:
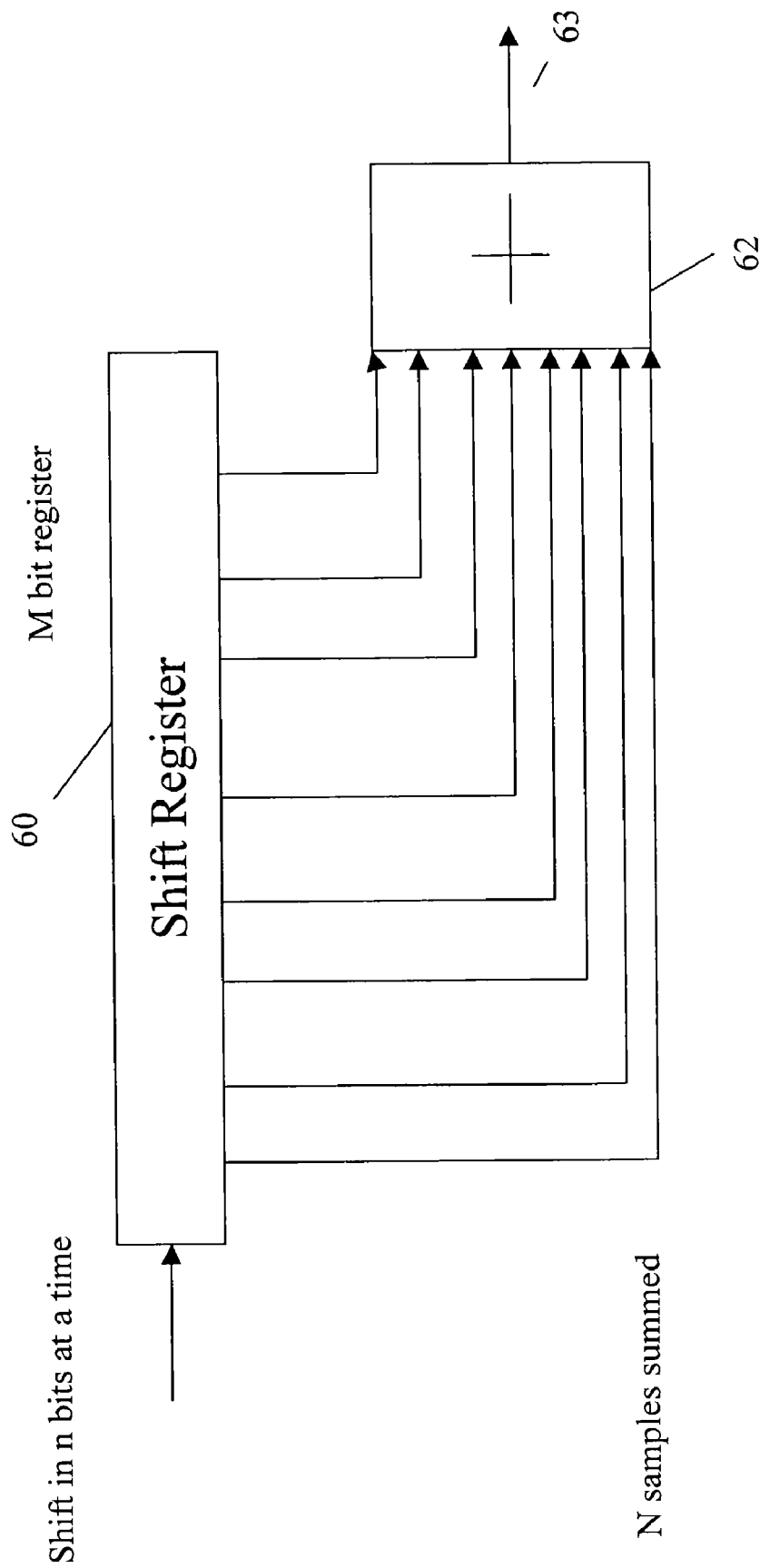
FIG. 4: shows one arrangement of a decimator.

One embodiment of the decimator 26 is shown in FIG. 4 and comprises a shift register 60 and adder 62. The decimator sums N samples together (here 8 samples are summed) to produce an output on line 63. In this example, 8 samples of the digitized received signal are summed giving possible outputs −8 to +8. To represent the possible outputs, the output values 0, 1, 2 or 3 are represented as logic "0" and outputs 5, 6, 7 or 8 are represented as logic "1". To prevent any bias in the output, the value 4 is represented as alternately logic "0" and logic "1". The output on line 63 is therefore a digital bit sequence which is a downsampled version of the digitized received signal without any information being discarded.

The choice of 8-bit summing is apt as this is the ratio between the 16 MHz sampling of the received signal and 2 MHz of the received GPS signal. In fact, the exact figures are 16.368 MHz and 2.046 MHz being multiples of the 1.023 MHz chip rate as all the clocks in the system are synchronous.

Figure 5:
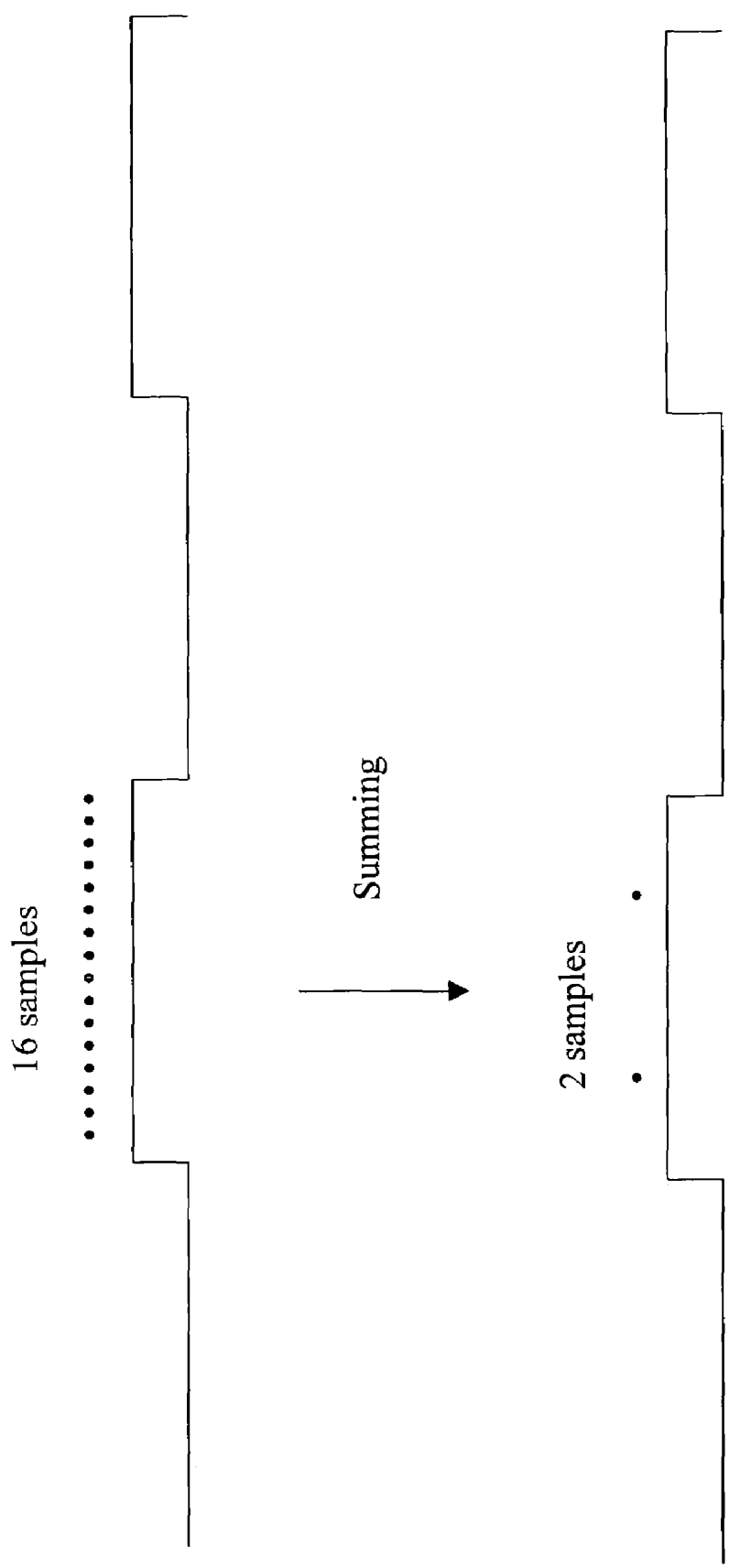
FIG. 5: shows the sampling of the signal.

Whilst at first sight it may appear that information is lost by summing received samples this is not the case as can be seen with reference to FIG. 5. The initial sampling of the received signal is at 16 MHz (FIG. 2a) producing 16 samples per CA code chip (the chip rate being 1 MHz). Thus the summing of 8 samples effectively produces 2 samples per CA code chip.

The sampled and summed signal can therefore be correlated with the appropriately locally generated CA code to acquire the signal to within one chip (microsecond). Once acquired, the signal can be tracked to an accuracy of the 16 MHz sampling (of the order tens of nanoseconds).

Other summing ratio are possible, such as N=4 or N=16. In such cases, the system can remain synchronous in that the clocks for sampling and summing are all derived by even integer division of a common clock.

Figure 6:
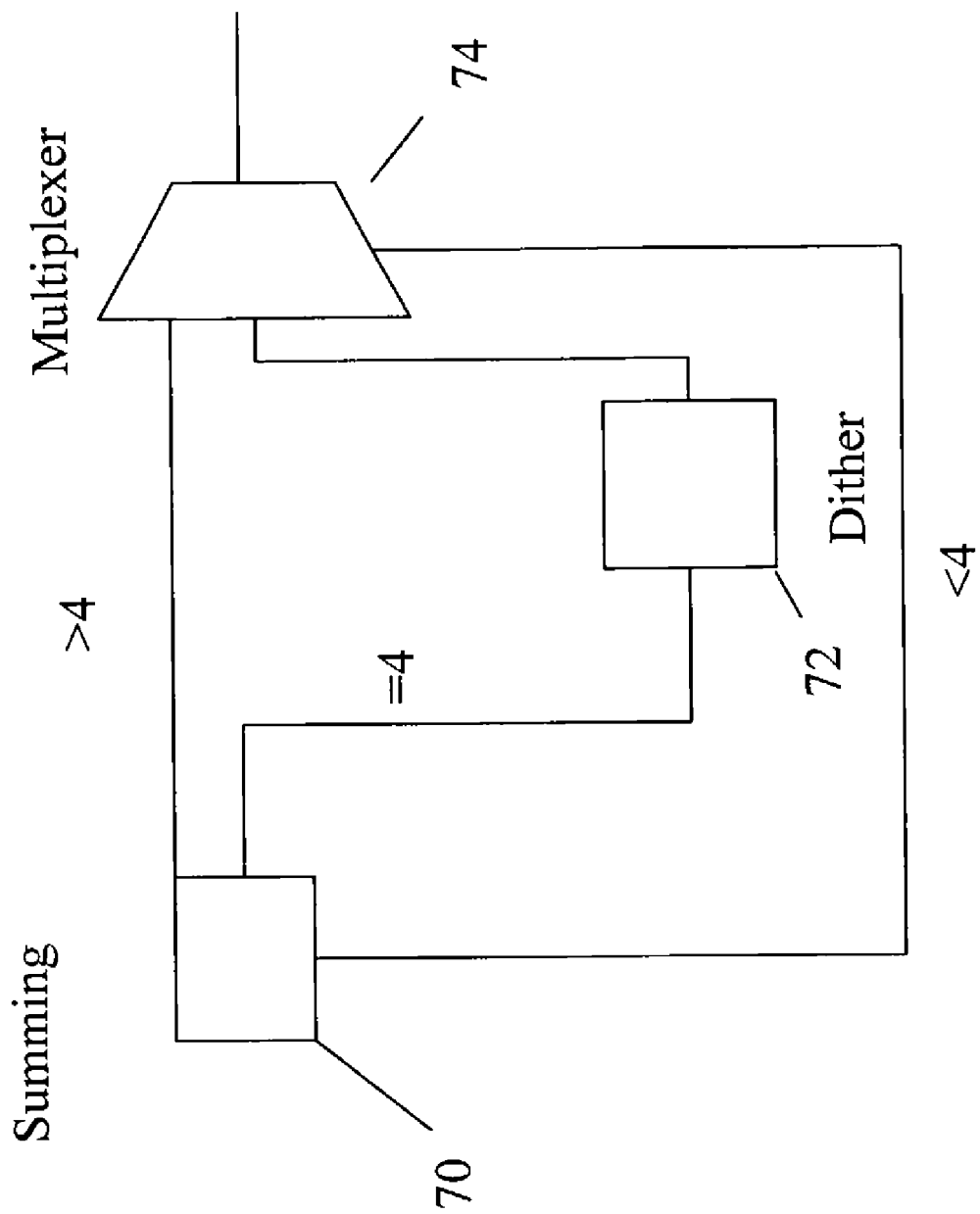
FIG. 6: shows an alternative decimator.

The decimator could also take the form shown in FIG. 6. In this form, the line >4 is logic "1" when the output of adder 70 is >4, and similarly lines =4 and <4 are asserted when the output of the adder is 4 and <4 respectively.

A dither function alternately presents 0 or 1 whenever the line =4 is asserted. The output of multiplexer 74 is thus either the >4 output or a dithered logic "0"or "1". Now as the >4 output is "0" if the sum is not >4 or "1" if the output is >4 the result is effectively the summing of 8 samples.

Further summing values for N and M are possible. An example of summing an odd number is to shift N=8 samples at a time into a register of M=9 bits and sum N=8. In this example, the eight-bit will be summed twice, but we now have no need to have a dither bit as a sum of 0, 1, 2, 3 or 4 is represented as logic "0" and 5, 6, 7, 8 or 9 represented as logic "1" (there are equal chances of logic "0" or "1" occurring). Similarly, division by 17 would involve values 0 to 8 being represented as logic "0" and values 9 to 17 being represented as logic "1".

Other alternatives include shifting N=8 bits but sum N=7 bits such that values 0 to 3 are logic "0" and values 4 to 7 are logic "1". This alternative does actually discard a sample, but has no effect on the signal to noise ratio.

As previously described, the particular benefit is obtained when the acquisition runs at greater than 2046 real time. In this situation, the acquisition can be performed on the signal as actually received in real time. This is 2×1024 (the chip length). The factor of 2 is to avoid the sampling occurring at chip boundaries which would occur in a synchronous system.

Figure 7:
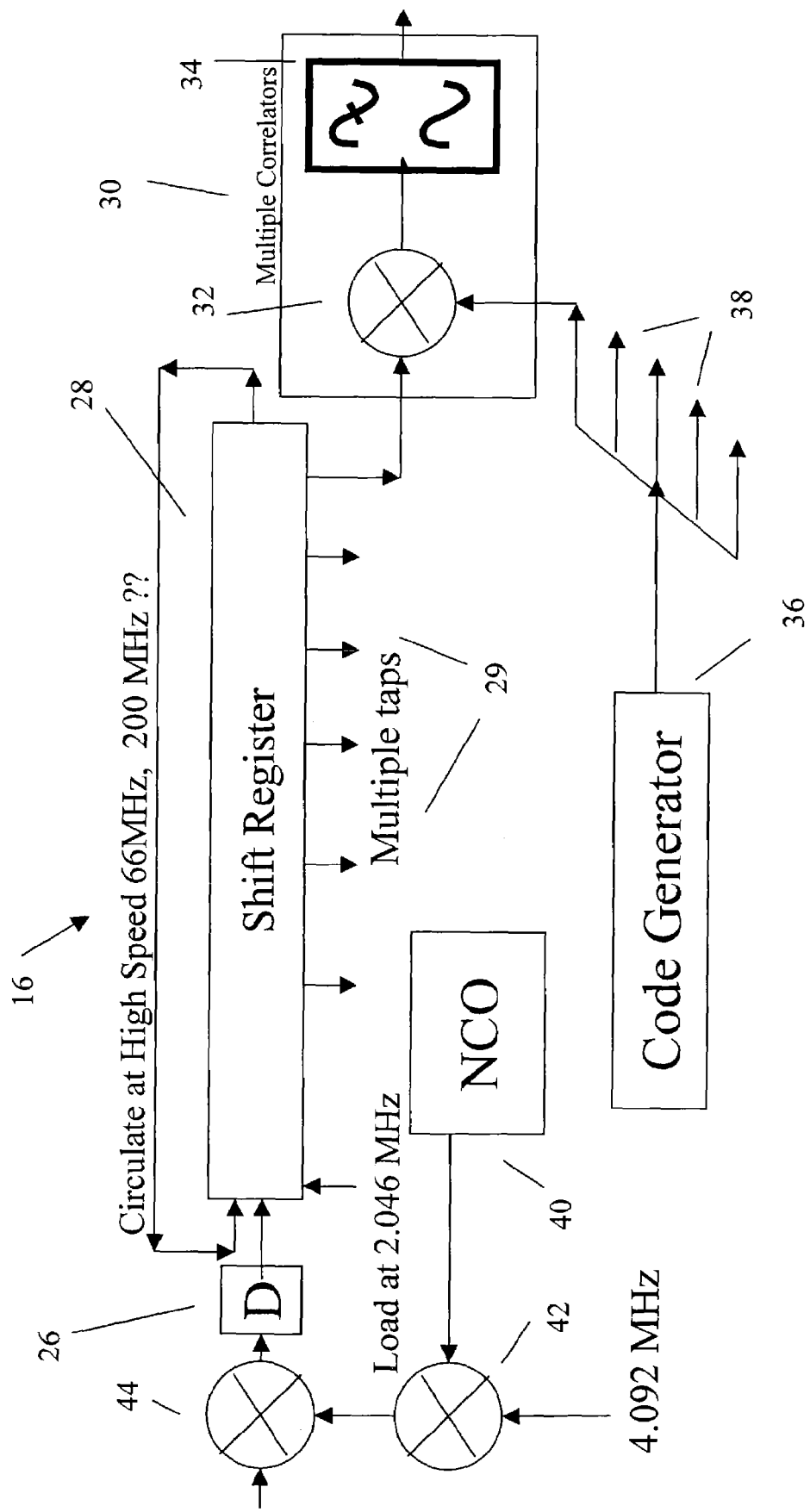
FIG. 7: shows an alternative semiconductor circuit of an embodiment of the invention.

Another embodiment using only a single shift register is shown in FIG. 7. Although not shown, there are 16 separate correlators—one for each channel. Also, the figure only shows one of the inphase (I) and quadrature (Q) channels for simplicity.

An incoming signal is mixed down by gate 44, fed with a locally generated 4.092 MHz. A decimator 26 comprises combinatorial logic to combine groups of 8 samples to reduce the sample rate without discarding information as before. It is noted, for the avoidance of doubt, that the decimation is not simply removing every $10^{th}$ sample. The decimated signal is loaded to a shift register 28 having multiple taps 29 which feed to correlators 30. The shift register is operable, when loaded, to circulate at a higher speed than the loading speed, such as 66 MHz or 200 MHz, preferably 128 MHz in one example embodiment. Each tap 29 feeds a separate correlator 30 (only one being shown for simplicity). A code generator 36 generates a local version of the respective CA code and applies this to the correlator 30. The correlator includes combinatorial logic (e.g, multiplexer 32) which combines the local version of the CA code with the decimated received signal from the tap points 29 of the circulating shift register. A low pass filter 34 provides the output.

The operation of the channel 16 is in two modes: an acquire mode and a tracking mode. The acquire mode will be described first. On first receiving a satellite signal which has been sampled at 16 MHz, the timing of the satellite which sent the signal and the relative distance are both unknowns. Accordingly, 2,046 (2×1,023 chips of the CA code) comparisons are performed to determine the relative time difference between the local version of the CA code and the received signal. The received signal is first decimated, though, to reduce the samples by a factor of 8. The decimated samples are fed to the shift register at 2.046 MHz which then circulates at a higher speed such as 66 MHz or 200 MHz, preferably 128 MHz in one example embodiment. Each of 16 tap points 29 is fed to a respective correlator 30. The 16 correlators 30 each receive the same CA code for a given satellite from the code generator 36. There are thus effectively 16 correlators running in parallel on a signal which is reduced by a factor of 8 samples at a speed which is a multiple of the usual speed. If the speed is 66 MHz, this is 4 times faster than usual so the system is 4×8=32 times faster than 16 channels without decimation or the high-speed register. If the speed is 200 MHz, this is 12 times faster than usual so that system is 12×8=96 times faster than 16 channels without decimation on the high-speed register.

The increase in speed means either a faster acquisition or more sensitivity in the same time. For example, 32 times faster means 32 times more sensitive at the same acquisition speed giving around 15 dB gain.

When the signal has been acquired (the relative time difference has been calculated by the correlations) there is less need for high-speed correlation. Accordingly, the channels enter a second mode: the tracking mode. In this mode the decimator 26 no longer decimates the incoming signal. The code generator 36 now supplies a different respective code to each of the 16 correlators, one for each respective satellite to be tracked. The relative positions of the incoming and local signal are now known to a degree of accuracy of a few nanoseconds rather than being unknown and so can be tracked using the early and late signals discussed before.

Whilst an embodiment cannot operate to perform all possible correlations in real time (because the received digitized data will be at a faster rate than the correlations), the single shift register embodiment still provides some speed advantage.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A semiconductor integrated circuit for processing a plurality of received broadcast signals, the broadcast signals being of a type each having a different respective digital code, the semiconductor integrated circuit comprising:
- a digital sampler;
- a sample reducer; and
- a plurality of correlators being arranged to be operable in two modes wherein:
- in an acquisition mode:
  - the digital sampler is adapted to sample the received broadcast signals to produce a digital bit stream at a first bit rate;
  - the sample reducer is adapted to reduce bits of the digital bit stream by combining groups of N bits together to produce a reduced digital bit stream;
  - the plurality of correlators is adapted to receive the reduced digital bit stream at a second bit rate, being higher than the first bit rate, and each of the plurality of correlators is adapted to correlate the reduced digital bit stream with a same locally generated version of one of the different digital codes; and
- in a track mode:
  - the digital sampler is adapted to sample the received broadcast signals to produce a digital bit stream at the first bit rate and to provide the digital bit stream direct to each of the plurality of correlators, each correlator is adapted to correlate the digital bit stream with a different locally generated version of one of the digital codes, wherein for the acquisition mode, the sample reducer includes an adder to add the groups of N bits, wherein in the acquisition mode, the adder is adapted to provide a digital output representative of a value of a sum of the N bits, and wherein in the acquisition mode, the adder is adapted to provide an output having a first logic state if the sum of the N bits is greater than a given value and an output having a second logic state opposite to said first logic state if the sum of N bits is less than the given value.

2. The semiconductor integrated circuit according to claim 1 wherein in acquisition mode, the adder is adapted to alternately provide said first logic state and said second logic state if the sum of the N bits is equal to the given value.

3. The semiconductor integrated circuit according to claim 1 wherein in acquisition mode the second bit rate is a factor M higher than the first bit rate.

4. The semiconductor integrated circuit according to claim 3 wherein there are Y correlators such that in acquisition mode a correlation rate is a factor X=N (bits)×M (bit rate factor)×Y (correlators) faster than a correlation rate in the track mode for one of the digital codes.

5. The semiconductor integrated circuit according to claim 4 wherein the factor X is chosen to be substantially equal or greater than twice a number of bits in the code, wherein all possible correlations of the code are performed before the code repeats.

6. The semiconductor integrated circuit according to claim 5 wherein the digital code is a GPS position code of 1,023 bits and wherein the factor X is arranged to be 2,048.

7. The semiconductor integrated circuit according to claim 1, further comprising a memory to receive the reduced digital bit stream and to output the reduced digital bit stream at the second bit rate to the plurality of correlators.

8. The semiconductor integrated circuit according to claim 7 wherein the memory includes a circulating shift register.

9. The semiconductor integrated circuit according to claim 8 wherein the circulating shift register receives the reduced digital bit stream at a rate equal to the first bit rate divided by N and circulates at the second bit rate.

10. The semiconductor integrated circuit according to claim 7 wherein the memory includes two shift registers arranged to alternately receive the reduced digital bit stream while another of the two shift registers circulates at the second bit rate.

11. The semiconductor integrated circuit according to claim 1 wherein the broadcast signals include global position (GPS) signals.

12. A method of processing a plurality of received broadcast signals each having a different respective digital code, the method comprising:
- sampling the received broadcast signals to produce a digital bit stream at a first bit rate;
- reducing bits of the digital bit stream by combining groups of N bits to produce a reduced bit stream;
- correlating the reduced digital bit stream at a second bit rate using a plurality of correlators each correlating the reduced digital bit stream with a same one of a locally generated version of the digital codes to acquire the broadcast signals; and
- subsequently correlating the digital bit stream at the first bit rate using the plurality of correlators each correlating the digital bit stream with a locally generated version of a different one of the digital codes to track the previously acquired signals, wherein the reducing the bits of the digital bit stream includes summing groups of N bits, wherein the summing produces a digital output representative of the sum, and wherein the summing produces a first logic state if the sum of N bits is greater than a given value and a second logic state opposite to said first logic state if the sum is less than the given value.

13. The method according to claim 12 wherein the summing alternately provides said first logic state and second logic state if the sum of N bits is equal to the given value.

14. The method according to claim 12 wherein the second bit rate is a factor M higher than the first bit rate.

15. The method according to claim 14 wherein there are Y correlators such that when correlating to acquire, a correlation rate is a factor X=N (bits) ×M (bit rate factor)×Y (correlators) faster than a correlation rate when tracking the acquired signals.

16. The method according to claim 15 wherein the factor X is chosen to be substantially equal or greater than twice a number of bits in the code, wherein all possible correlations of the code are performed before the code repeats.

17. The method according to claim 12 wherein the broadcast signals include global position (GPS) signals.

18. An apparatus to process a plurality of received broadcast signals having digital codes, the apparatus comprising:
- a sampler unit to sample the received broadcast signals to produce a digital bit stream at a first bit rate in an acquisition mode;
- a reducer unit coupled to the sampler unit to reduce a number of bits of the digital bit stream via combination of groups of N bits together to produce a reduced digital bit stream in the acquisition mode; and
- a correlator unit coupled to the reducer unit to receive the reduced digital bit stream at a second bit rate and to correlate the reduced digital bit stream with one of the digital codes in the acquisition mode, and wherein the sampler unit is coupled to the correlator unit to directly provide the digital bit stream at the first bit rate to the correlator unit in a track mode and further wherein the correlator unit is adapted to correlate that digital bit stream with a different one of the digital codes in the track mode, wherein the reducer unit includes an adder to add the groups of N bits in the acquisition mode to obtain a sum, and wherein further in the acquisition mode:

the adder is coupled to provide a digital output representative of the sum;

the adder is coupled to provide a first binary value if the sum is greater than a given value and a second binary value if the sum is less than the given value; and the adder is coupled to alternately provide the first binary value and the second binary value if the sum is equal to the given value.

19. The apparatus of claim 18 wherein the correlator unit includes a plurality of correlators to correlate the reduced digital bit stream at the second bit rate with a same one of the digital codes in the acquisition mode.

20. The apparatus of claim 18 wherein the digital codes for the correlations include locally generated versions of the digital codes of the received broadcast signals.

21. The apparatus of claim 18 wherein the second bit rate is higher than the first bit rate in the acquisition mode.

22. The apparatus of claim 18 further comprising a memory arrangement coupled to the correlator unit to receive the reduced digital bit stream and to output the reduced digital bit stream to the correlator unit at the second bit rate.

23. The apparatus of claim 22 wherein the memory arrangement includes a circulating shift register.

24. A system to process a plurality of received broadcast signals having digital codes, the system comprising:

means for sampling the received broadcast signals to produce a digital bit stream at a first bit rate;

means for reducing a number of bits of the digital bit stream by combining groups of N bits to produce a reduced digital bit stream; and means for correlating the reduced digital bit stream with one of the digital codes to acquire the broadcast signals, and for correlating the digital bit stream at the first bit rate with a different one of the digital codes to track the acquired broadcast signals, wherein the means for reducing the number of bits of the digital bit stream by combining groups of N bits includes means for summing the groups of N bits to obtain a sum, the means for summing including:

means for providing a first binary value if the sum is greater than a given value and a second binary value if the sum is less than the given value; and means for alternately providing the first binary value and the second binary value if the sum is equal to the given value.

25. The system of claim 24 wherein the means for reducing the number of bits of the digital bit stream produces the reduced digital bit stream at a second bit rate higher than the first bit rate.

26. The system of claim 24 wherein the broadcast signals include global position (GPS) signals.

27. The apparatus of claim 18 wherein the broadcast signals include global position (GPS) signals.

* * * * *